(12) United States Patent
Wu et al.

(10) Patent No.: US 6,456,084 B1
(45) Date of Patent: Sep. 24, 2002

(54) RADIATION TEST SYSTEM

(75) Inventors: Kuang-Shyr Wu; Maw-Ching Lin; Li-Shen Juhn, all of Taoyuan Hsien (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 9 days.

(21) Appl. No.: 09/819,374

(22) Filed: Mar. 28, 2001

(51) Int. Cl.[7] .............................................. G01R 31/00
(52) U.S. Cl. ........................ 324/501; 324/713; 324/765
(58) Field of Search ................................. 324/501, 537, 324/713, 750, 765; 250/370.06, 492.2

(56) References Cited

U.S. PATENT DOCUMENTS

| | | | | |
|---|---|---|---|---|
| 3,723,873 A | * | 3/1973 | Witteles | 324/765 |
| 4,172,228 A | * | 10/1979 | Gauthier | 324/537 |
| 4,575,676 A | * | 3/1986 | Palkuti | 324/501 |
| 4,816,753 A | * | 3/1989 | Palkuti | 324/501 |
| 4,839,586 A | * | 6/1989 | Musseau | 324/501 |
| 5,753,920 A | * | 5/1998 | Buehler | 250/370.06 |

* cited by examiner

Primary Examiner—Christine K. Oda
(74) Attorney, Agent, or Firm—J.C. Patents

(57) ABSTRACT

A radiation test system that couples with a radiation test field and a radiation controller. The radiation controller records the flow of radiation particles and the test results obtained from a test component. The radiation controller also controls a radiation particle accelerator so that the test component is irradiated with a cyclically varying radiation beam. The radiation test system further includes a daughter board, a motherboard, a power source, a near-end monitor and a far-end monitor. The near-end monitor is responsible for initiating a test program to test the test program, monitoring the test status and recording the test data. The far-end monitor remotely controls the near-end monitor to initiate an irradiation testing of the test component. The far-end monitor also receives test data submitted by the near-end monitor so that test results may be further analyzed.

9 Claims, 2 Drawing Sheets

RADIATION TEST SYSTEM

BACKGROUND OF THE INVENTION

1. Field of Invention

The present invention relates to a radiation test system. More particularly, the present invention relates to a radiation system having a set of testing steps capable of reducing setup time and facilitating operation.

2. Description of Related Art

In aerospace industry, electronic components are often sent to outer spacer for a particular mission. Since these components may be bombarded by intense radiation in outer space for long periods, stringent radiation checks are required. For example, components used on satellites have to undergo intensive radiation testing. Those failing the radiation test are immediately discarded. For those that pass the radiation test, only the best component is selected.

The setup and maintenance of a radiation test field is expensive. Due to special shielding regulations, facilities within the testing field may not be modified at will. Most often than not, a test is carried out using original equipment within the testing field. Components to be tested are usually placed inside the radiation field connected to a nearby computer. All testing is controlled at a remote site through keyboards and monitors connected to the in-field computer by extension cables. In general, different test components may require different control interface and hence a different setup.

To protect people against hazardous radiation, personnel involved in radiation testing must be confined to the remote control center. Should any problem occur inside the radiation field, error rectification has to be delay until radiation has died down. However, testing time within a radiation test field is usually limited. For example, if three components each requiring 7 hours of continuous testing need to be tested in a day, actual time remaining for error detection and wire changing is minimal. In addition, the cost of operating a radiation test field is astronomical. Hence, slight increase in operational time may entail a huge monetary waste.

SUMMARY OF THE INVENTION

Accordingly, one object of the present invention is to provide a radiation test system having a set of testing steps capable of reducing setup time and facilitating operation.

To achieve these and other advantages and in accordance with the purpose of the invention, as embodied and broadly described herein, the invention provides a radiation test system. The radiation test system is coupled to a radiation test field and a radiation controller. The radiation controller records flow of radiation particles and test results of a test component. The radiation controller also controls a radiation particle accelerator so that the test component is irradiated with a cyclically varying radiation beam. The radiation test system further includes a daughter board, a motherboard, a power source, a near-end monitor and a far-end monitor. The daughter board holds and makes electrical connections with the test component. The motherboard is coupled to the radiation controller. The motherboard houses and makes electrical connections with the daughter board. The power source provides necessary electrical power to the motherboard and the test component. The near-end monitor is connected to the motherboard via a short transmission cable. The far-end monitor is connected to the near-end monitor through a long transmission cable.

The radiation controller transmits irradiation signals to the motherboard and informs the motherboard about the irradiation period. The motherboard transmits error signals resulting from an overload current in the test component to the radiation controller and informs the radiation controller to stop radiation count. Bi-directional transmission between the motherboard and the radiation controller is achieved through an RS-232 interface. The near-end monitor triggers a testing program driving the motherboard such that current testing state is monitored and testing data are recorded. During a continuous irradiation cycle, the motherboard also transmits test data produced by the test components to the near-end monitor. The far-end monitor is capable of remotely controlling the near-end monitor so that irradiation test on the test component can be executed. Furthermore, the far-end monitor is capable of receiving test data submitted by the near-end monitor so that post-irradiation status of the test component can be gauged.

This invention also provides an alternative radiation test system. The radiation test system is coupled to a radiation test field and a radiation controller. The radiation controller records the flow of radiation particles and test results of a test component. The radiation controller also controls a radiation particle accelerator to produce a cyclically varying irradiation on the test component. The radiation test system further includes a daughter board, a transmission cable connector, a digital signal processor, a data buffer, a first address & control buffer, a decoder & universal asynchronous transceiver circuit, a power protection circuit & data latch, a second address & control buffer, a control buffer, a power supply, a near-end monitor and a far-end monitor.

The daughter board holds and makes electrical connections with the test component. The transmission cable connector is a connector with a short transmission cable. The digital signal processor is coupled to the transmission cable connector and driven by a test program to produce a test pattern. Test data produced by the test component is transmitted by the transmission cable connector. The data buffer is a data bus for isolating the digital signal processor and the daughter board. The data buffer also provides data bus signals for driving the digital signal processor. The first address & control buffer is an address and control signal bus for isolating the digital signal processor and the daughter board. The decoder & universal asynchronous transceiver circuit decodes data from the data bus signal so that control signals for controlling the test component is generated. The decoder & universal asynchronous transceiver circuit also receives irradiation signals produced by the radiation controller and outputs an error signal due to an overload current in the test component to the radiation controller. A bi-directional transmission of commands and test results is achieved via an RS-232 interface. The power protection circuit & data latch is coupled to the decoder & universal asynchronous transceiver circuit for providing power to the test component. When current load occurs in the test component, power to the test component is cut and a current overload signal is transmitted to the digital signal processor. In the meantime, data signals from the digital signal processor are latched so that necessary preset signals, reset signals, power-triggering signals and error signals are provided. The second address & control buffer is able to providing necessary signal to the digital signal processor for driving the decoder/general-purpose asynchronous transceiver circuit. The control buffer picks up control signals from the decoder & universal asynchronous transceiver circuit and transmits the signals to the daughter board. The power supplier provides power to various modules and the test component in the radiation test system. The near-end monitor is connected to the transmission cable connector via a short electrical cable. The near-end monitor is responsible for triggering and terminating test programs as well as monitoring and recording test status and test data of the test component. The far-end monitor is connected to the near-end monitor through a long electrical cable. The far-end monitor not only receives test status and data from the test component, but also controls the near-end monitor to initiate radiation test.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
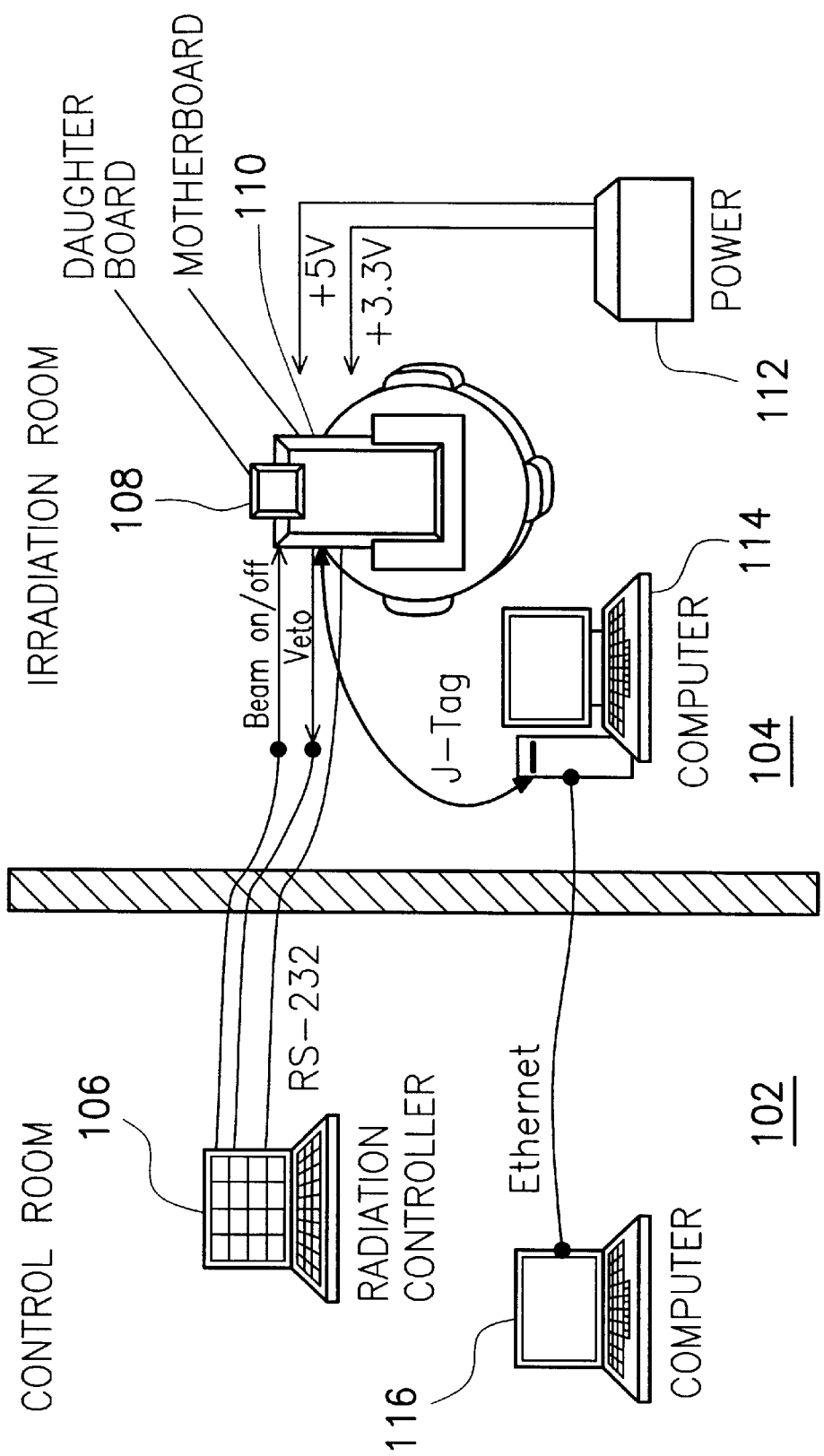
FIG. 1 is a schematic showing components and interconnections of a radiation test system according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic showing components and interconnections of a radiation test system according to one preferred embodiment of this invention. As shown in FIG. 1, a radiation controller 106 is placed inside a control room 102 of a radiation test field. The radiation controller 106 records the flow of radiation particles and the test results of a test component (the test component can be a SDRAM, a Flash ROM, a CPLD or a Watch-dog Timer, for example). The radiation controller 106 also controls the generation of radiation particles by an accelerator (not shown) so that the test component is irradiated with cyclically varying radiation.

The test component (not shown) is plugged into the socket on a replaceable daughter board 108. The daughter board 108 has connecting pins that can be reset to produce the test signals required by the test component. The daughter board 108 is also capable of testing two functionally identical test components (not shown) at the same time. During testing, only the test component (not shown) and the daughter board 108 are subjected to irradiation.

A motherboard 110 is coupled to the radiation controller 106. The daughter board 108 and the motherboard 110 are electrically connected. A power supplier 112 provides necessary power (a 5V or a 3.3V) to the motherboard 110 and the test component (not shown). A computer 114 is connected to the motherboard 110 through a J-Tag transmission cable connector. Through an Ethernet transmission cable, the computer 116 may hook up with another computer 114.

The radiation controller 106 transmits irradiation signals (radiation beam on/off signals) to the motherboard 110 to inform the motherboard 110 about the radiation status. Should current overload occurs while the test component (not shown) is undergoing a testing, the motherboard 110 will transmit a veto signal to the radiation controller 106 informing the controller 106 to terminate the radiation count. As soon as all test equipment is ready, the radiation controller 106 and the motherboard 110 communicate with each other through an RS-232 interface. To begin the testing, an INIT command is issued from the radiation controller 106 inside the control room 102 to the motherboard 110. On receiving the initiation signal, the motherboard 110 transmits a group of test data to the computer 114 after each irradiation cycle (each cycle includes a radiation-off and a radiation-on). After the completion of several tens of irradiation cycles, the testing operation is temporarily suspended by the motherboard 110 and the test data is stored inside the computer 114. Thereafter, the irradiation strength, angle or radiation type is changed before the testing operation is continued.

The computer 114 uses triggered testing programs to drive the motherboard 110 so that the test component is activated, status of the test component is monitored and the resulting test data is recorded. During the testing operation, the computer 116 also receives test data from the computer 114 through an Ethernet transmission cable so that radiation test status of the test component (not shown) is monitored. Should the computer 116 discover any abnormality of the test component (not shown), the computer 116 may signal to the computer 114 so that the radiation testing is immediately halted.

Figure 2:
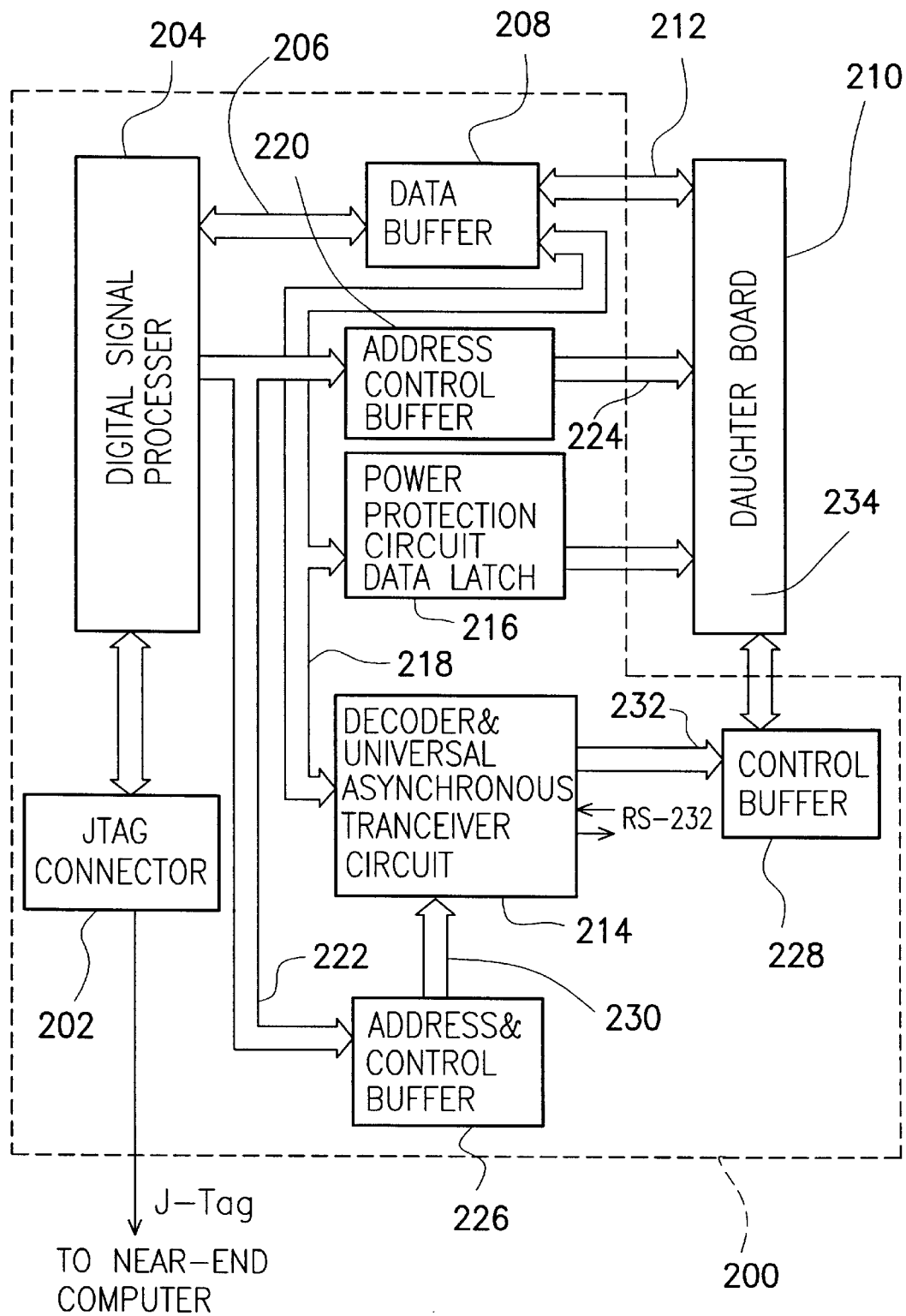
FIG. 2 is a block diagram showing a motherboard system for the radiation test system according to this invention.

FIG. 2 is a block diagram showing a motherboard system for the radiation test system according to this invention. As shown in FIG. 2, the motherboard 200 includes a JTAG connector 202, a digital signal processor 204, a data bus 206, a data buffer 208, a data bus 212, a decoder & universal asynchronous transceiver circuit 214, a power protection circuit & data latch 216, a data bus 218, an address & control buffer 220, an address & control signal bus 222, an address & control signal bus 224, a RS-232 interface, an address & control buffer 226, a control buffer 228, an address & control signal bus 230, a bus 232 and another bus 234.

The JTAG connector 202 on the motherboard 200 is a J-tag transmission cable connector. The digital data processor 204 is connected to the JTAG connector 202 and the JTAG connector 202 is in turn connected to a near-end computer 114 (refer to FIG. 1). The digital signal processor 204 is driven by a test program submitted by the near-end computer 114. The digital signal processor 204 not only provides a test pattern to the data bus 206, but also reads test data from the data bus 206 and transmits the data back to the computer 114 (refer to FIG. 1).

The data buffer 208 isolates the data bus 206 and the data bus 212 between the digital signal processor 204 from the daughter board 210. Hence, normal operation of the digital signal processor 204 is safeguarded against the effect of any current overload in the test component (not shown). The data buffer 208 also provides data to the data bus 218. Signals sent to the data bus 218 drives the digital signal processor, the decoder & universal asynchronous transceiver circuit 214 and the power protection circuit & data latch 216. The address & control buffer 220 isolates the address & control signal bus 222 and the address & control signal bus 224 between the digital signal processor 204 and the daughter board 210. Similarly, this is to safeguard the digital signal processor 204 against any effect due to current overload in the test component (not shown).

The decoder & universal asynchronous transceiver circuit 214 decodes signals on the data bus 218 so that signals necessary for controlling the test component (not shown) is produced. Through the RS-232 interface, instructions and test results shuttle between the transceiver circuit 214 and a radiation controller (not shown). Furthermore, radiation test signals (radiation on/off) and veto signals also shuttle between the transceiver circuit 214 and the radiation controller via signal lines (not shown).

The decoder & universal asynchronous transceiver circuit 214 may also include an asynchronous transceiver control circuit (not shown). The asynchronous transceiver control circuit (not shown) may further include random generator modules, serial-to-parallel receiving modules, parallel-to-serial receiving modules, receiving and transmitting status and output modules, odd-even generator & detection modules and interface control module (all the modules not shown). Signals or data are transmitted according to their respective functions of the modules.

The power protection circuit & data latch 216 is coupled to the decoder & universal asynchronous transceiver circuit 214 for providing power to the testing component (not shown). Should current overload occur in the test component, the power protection & data latch 216 will cut off power to the test component and send a current overload signal to the digital signal processor 204 via the data buses 218 and 206. In the meantime, data signals sent from the digital signal processor 204 is arrested serving as subsequent set-reset signals, power-triggering signals and veto signals for the power protection circuit & data latch 216. Hence, the power protection circuit & data latch 216 can be set or reset so that power is supplied to the test component again.

The address & control buffer 226 provides signals from the digital signal processor 204 to the decoder & universal asynchronous transceiver circuit 214 via the address and control signal bus 230. The control buffer 228 receives decoded control signals from the decoder & universal asynchronous transceiver circuit 214 and retransmits the signals to the daughter board 210. The control buffer 228 isolates the buses 232 and 234 between the decoder & universal asynchronous transceiver circuit 214 and the daughter board 210. Hence, normal operation of the decoder & universal asynchronous transceiver circuit 214 is safeguarded against the effect of any current overload in the test component (not shown).

In conclusion, one major advantage of using the general-purpose testing board to test different components is that independent design of the testing board is not required. By changing the testing steps, local on-site pre-simulation can be conducted. Hence, time required to set up an actual testing field is greatly reduced. Ultimately, an easy to maintain and operate radiation test system capable of on-line monitoring of test component is produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A radiation test system coupled to a radiation test field and a radiation controller, wherein the radiation controller records the flow of radiation particles and the test results of a test component and controls a radiation particle accelerator so that the test component is subjected to a cyclically varying irradiation, the radiation test system comprising:

a daughter board for holding and connecting electrically with the test component;

a motherboard for coupling with the radiation controller, wherein the motherboard houses and connects electrically with the daughter board;

a near-end monitor connected to the motherboard via a short transmission cable; and a far-end monitor connected to the near-end monitor via a long transmission cable;

wherein the radiation controller transmits irradiation signals to the motherboard and informs the motherboard about the irradiation period, the motherboard transmits error signals resulting from an overload current in the test component to the radiation controller and informs the radiation controller to stop radiation count, an RS-232 interface permits a bi-directional transmission of instructions and test results between the motherboard and the radiation controller, the near-end monitor triggers a testing program driving the motherboard such that current testing state is monitored and testing data are recorded, during a continuous irradiation cycle, the motherboard also transmits test data produced by the test components to the near-end monitor, the far-end monitor controls the near-end monitor remotely so that irradiation test on the test component can be initiated and receives test data submitted by the near-end monitor so that post-irradiation status of the test component can be gauged.

2. The radiation test system of claim 1, wherein the test system further includes a power supplier for supplying power to the motherboard and the test component.

3. The radiation test system of claim 1, wherein the near-end monitor and the far-end monitors are computer.

4. The radiation test system of claim 1, wherein the motherboard further comprises of:

a transmission cable connector, wherein the connector is a short transmission cable connector;

a digital signal processor, wherein the digital signal processor is coupled to the transmission cable connector and controlled by the near-end controller to produce a test pattern, and test data are transmitted to the near-end monitor via the transmission cable connector;

a data buffer, wherein the data buffer isolates a data bus between the digital signal processor and the daughter board and provides the data bus signals necessary for driving the digital signal processor;

a first address and control buffer, wherein the first address and control buffer isolates an address and control signal bus between the digital signal processor and the daughter board;

a decode and universal asynchronous transceiver circuit, wherein the transceiver circuit decodes data from the data buffer and produces control signals necessary for testing the test component, and the transceiver circuit transmits and receives instructions and test results with an external circuit via a RS-232 interface;

a power protection circuit and data latch, wherein the power protection circuit and data latch is coupled to the decode and universal asynchronous transceiver circuit providing power to the test component and cutting off power when current overload in the test component occurs, the power protection circuit and data latch also transmits a current overload signal to the digital signal processor and arrests data signal submitted by the digital signal processor so that set and reset signals, power-triggering signals and errors signals are provided;

a second address and control buffer, wherein the second address and control buffer provides signals necessary for the digital signal processor to drive the decoder and universal asynchronous transceiver circuit; and a control buffer, wherein the control buffer re-transmits the signal from the decoder and universal asynchronous transceiver circuit to the daughter board.

5. The radiation test system of claim 4, wherein the decoder and universal asynchronous transceiver circuit may further includes an asynchronous transceiver control circuit, and the asynchronous transceiver control circuit comprises of a random number generator module, a serial-to-parallel output receiving module, a parallel-to-serial output transmitting module, an output module for receiving and transmitting status information, an odd-even generator and detection module and an interface control module for a microprocessor or digital signal processor.

6. A radiation test system coupled to a radiation test field and a radiation controller, wherein the radiation controller records the flow of radiation particles and the test results of a test component and controls a radiation particle accelerator so that the test component is subjected to a cyclically varying irradiation, the radiation test system comprising of:

a daughter board for holding and connecting electrically with the test component;

a transmission cable connector, wherein the transmission cable connector is a short transmission cable connector;

a digital signal processor, wherein the digital signal processor is coupled to the transmission cable connector and controlled by a test program from an external monitor to produce a test pattern, and test data obtained from the test component are transmitted back to the monitor via the transmission cable connector;

a data buffer, wherein the data buffer isolates a data bus between the digital signal processor and the daughter board and provides the data bus signals necessary for driving the digital signal processor;

a first address and control buffer, wherein the first address and control buffer isolates an address and control signal bus between the digital signal processor and the daughter board;

a decode and universal asynchronous transceiver circuit, wherein the transceiver circuit decodes data from the data buffer and produces control signals necessary for testing the test component, the transceiver circuit also receives an irradiation signal transmitted from the radiation controller and transmits an error signal to the radiation controller should a current overload in the test component occur, and the transceiver circuit transmits and receives instructions and test results with an external circuit via a RS-232 interface;

a power protection circuit and data latch, wherein the power protection circuit and data latch is coupled to the decoder and universal asynchronous transceiver circuit providing power to the test component and cutting off power when current overload in the test component occurs, the power protection circuit and data latch also transmits a current overload signal to the digital signal processor and arrests data signal submitted by the digital signal processor so that set and reset signals, power-triggering signals and errors signals are provided;

a second address and control buffer, wherein the second address and control buffer provides signals necessary for the digital signal processor to drive the decoder and universal asynchronous transceiver circuit;

a control buffer, wherein the control buffer re-transmits the signal from the decoder and universal asynchronous transceiver circuit to the daughter board;

a near-end monitor, wherein the near-end monitor is connected to the transmission cable connector via a short transmission cable for initiating and halting test programs, monitoring test status and recording test data of the test component; and a far-end monitor, wherein the far-end monitor is connected to the near-end monitor via a long transmission cable for receiving test status information and test data of the test component and controlling the near-end monitor to initiate radiation testing.

7. The radiation test system of claim 6, wherein the test system further includes a power supplier for supplying power to various modules in the radiation test system and the test component.

8. The radiation test system of claim 6, wherein the near-end monitor and the far-end monitors are computer.

9. The radiation test system of claim 6, wherein the decoder and universal asynchronous transceiver circuit may further includes an asynchronous transceiver control circuit, and the asynchronous transceiver control circuit comprises of a random number generator module, a serial-to-parallel output receiving module, a parallel-to-serial output transmitting module, an output module for receiving and transmitting status information, an odd-even generator and detection module and an interface control module for a microprocessor or digital signal processor.

* * * * *